(12) United States Patent
Leenders et al.

(10) Patent No.: US 8,902,403 B2
(45) Date of Patent: Dec. 2, 2014

(54) LITHOGRAPHIC APPARATUS AND DEVICE MANUFACTURING METHOD

(75) Inventors: Martinus Hendrikus Antonius Leenders, Rhoon (NL); Jozef Petrus Henricus Benschop, Veldhoven (NL); Alexander Viktorovych Padiy, Geldrop (NL); Tao Chen, Pearl River, NY (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 323 days.

(21) Appl. No.: 13/100,075

(22) Filed: May 3, 2011

(65) Prior Publication Data

US 2011/0273687 A1 Nov. 10, 2011

Related U.S. Application Data

(60) Provisional application No. 61/331,734, filed on May 5, 2010, provisional application No. 61/380,996, filed on Sep. 8, 2010.

(51) Int. Cl.
| | |
|---|---|
| *G03B 27/42* | (2006.01) |
| *G03B 27/53* | (2006.01) |
| *G03F 7/20* | (2006.01) |
| *G03B 27/52* | (2006.01) |

(52) U.S. Cl.
CPC ............ *G03B 27/42* (2013.01); *G03F 7/70325* (2013.01); *G03B 27/52* (2013.01)
USPC .............................................. 355/53; 355/30

(58) Field of Classification Search
CPC .................................................. G03F 7/70341

USPC ................................. 355/30, 53, 67; 250/548
See application file for complete search history.

(56) References Cited

U.S. PATENT DOCUMENTS

| 5,121,256 A | 6/1992 | Corle et al. |
|---|---|---|
| 7,092,069 B2 | 8/2006 | Schuster |

(Continued)

FOREIGN PATENT DOCUMENTS

| DE | 10332112 | 1/2005 |
|---|---|---|
| DE | 10 2009033823 | 4/2010 |

(Continued)

OTHER PUBLICATIONS

Bruce W. Smith, "Alternative Optical Technologies—More than curiosities?" Proc. of SPIE, vol. 7274, pp. 727402-1-727402-10 (2009).

(Continued)

*Primary Examiner* — Hung Henry Nguyen
(74) *Attorney, Agent, or Firm* — Pillsbury Winthrop Shaw Pittman LLP

(57) ABSTRACT

In a solid immersion lithography apparatus, the final element of the projection system is maintained at a distance of less than about 50 nm from the substrate by an actuator system. The final element may be formed as two parts, with a fluid, e.g. a liquid, confined between them. The actuator system may be controlled relative to a reference frame, which may be supported by a bearing. Backscatter detection can be used to determine if the distance between the final element and the substrate is too large. A cleaning device can clean the substrate between exposures.

23 Claims, 5 Drawing Sheets

(56) References Cited

U.S. PATENT DOCUMENTS

| | | | |
|---|---|---|---|
| 7,408,716 B2* | 8/2008 | Rostalski et al. | 359/649 |
| 7,463,423 B2* | 12/2008 | Loering et al. | 359/649 |
| 7,619,715 B2* | 11/2009 | Ono et al. | 355/53 |
| 2003/0174301 A1 | 9/2003 | Imanishi | |
| 2005/0030506 A1 | 2/2005 | Schuster | |
| 2006/0255247 A1 | 11/2006 | Saito et al. | |
| 2007/0195307 A1* | 8/2007 | Schuster et al. | 355/77 |
| 2008/0212436 A1 | 9/2008 | Zijp et al. | |
| 2008/0239890 A1 | 10/2008 | Asai | |
| 2008/0316456 A1* | 12/2008 | Shafer et al. | 355/67 |
| 2010/0091259 A1* | 4/2010 | Koizumi | 355/67 |

FOREIGN PATENT DOCUMENTS

| | | |
|---|---|---|
| JP | 2001-056300 | 2/2001 |
| JP | 2001-266343 | 9/2001 |
| JP | 2004-053303 | 2/2004 |
| JP | 2004-335064 | 11/2004 |
| JP | 2004-348927 | 12/2004 |
| JP | 2006-134382 | 5/2006 |
| WO | 2007/004144 | 1/2007 |

OTHER PUBLICATIONS

L.P. Ghislain et al., "Near-field photolithography with a solid immersion lens," Appl. Phys. Lett., vol. 74, No. 4, pp. 501-503 (Jan. 25, 1999).

Tao Chen et al., "Properties of induced polarization evanescent reflection with a solid immersion lens (SIL)," Optics Express, vol. 15, No. 3, pp. 1191-1204 (Feb. 5, 2007).

Tao Chen et al., "Experimental investigation of solid immersion lens lithography," Proc. of SPIE, vol. 5754, pp. 254-261 (2005).

Bruce W. Smith et al., "25nm Immersion Lithography at a 193nm Wavelength," Proc. of SPIE, vol. 5754, pp. 141-147 (2005).

Japanese Office Action dated Jan. 16, 2013 in corresponding Japanese Patent Application No. 2011-099045.

* cited by examiner

LITHOGRAPHIC APPARATUS AND DEVICE MANUFACTURING METHOD

This application claims priority and benefit under 35 U.S.C. §119(e) to U.S. Provisional Patent Application Ser. No. 61/331,734, entitled "Lithographic Apparatus and Device Manufacturing Method", filed on May 5, 2010, and to U.S. Provisional Patent Application Ser. No. 61/380,996, entitled "Lithographic Apparatus and Device Manufacturing Method", filed on Sep. 8, 2010. The contents of those applications are incorporated herein in their entirety by reference.

FIELD

Embodiments of the present invention relate to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring. However, although EUV lithography should enable a significant reduction in pitch, significant problems with it still remain to be solved. Therefore, there is interest in other, alternative lithography techniques.

One alternative lithography technique is so-called solid immersion lithography (SIL). This is was described in "Alternative Optical Technologies—More than curiosities?" by Bruce Smith (Optical Microlithography XXII, edited by Harry J. Levinson, Mircea V. Dusa, Proc. of SPIE Vol. 7274, 727402 (2009)).

SUMMARY

The term solid immersion lithography is a little confusing because with SIL, a small gas (e.g., air) gap remains between the lens and the substrate. The evanescent field at the lens-gas interface jumps across the sub-100 nm gap to be frustrated by and re-propagate into a higher index media. The exponential decay is rapid, depending on the material refractive indices and angles involved, but sufficient transmission may be achieved. Instead of or in addition to gas in the gap, the gap can include a liquid, such as water, to improve transmission. For 28 nm half pitch using a sapphire lens of 1.72 NA, a water-filled gap of 30 nm produces 50% transmission in photoresist. A higher refractive index fluid might allow for a gap near 100 nm. The resolution in this example is nearly $\lambda/7$, compared with $\lambda/2n$ as the limit for conventional optical lithography.

However, it is difficult to maintain a constant gap as small as 30 nm, or even 100 nm, over a large area as is necessary for imaging structures or devices on a commercial scale.

It is desirable to provide a solid immersion lithography apparatus and a solid immersion lithography method in which a problem of the art is solved or alleviated and in particular a small constant gap between a lens and a substrate is maintained.

According to an aspect there is provided a lithographic projection apparatus arranged to project a pattern from a patterning device onto a substrate, the apparatus comprising: a projection system having a final element, the final element being a refractive optical element that is, in use, spaced away from the substrate by a distance of less than about 100 nm, and is divided into an inner part and an outer part and an actuator system configured to control the position and/or orientation of the inner part of the final element.

According to an aspect there is provided a device manufacturing method comprising: projecting a patterned beam of radiation onto a substrate using a projection system having a final element to project the patterned beam, the final element being a refractive optical element that is spaced away from the substrate by a distance of less than about 100 nm and being divided into an inner part and an outer part; and controlling the position and/or orientation of the inner part of the final element using an actuator system during the projection.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

Figure 1:
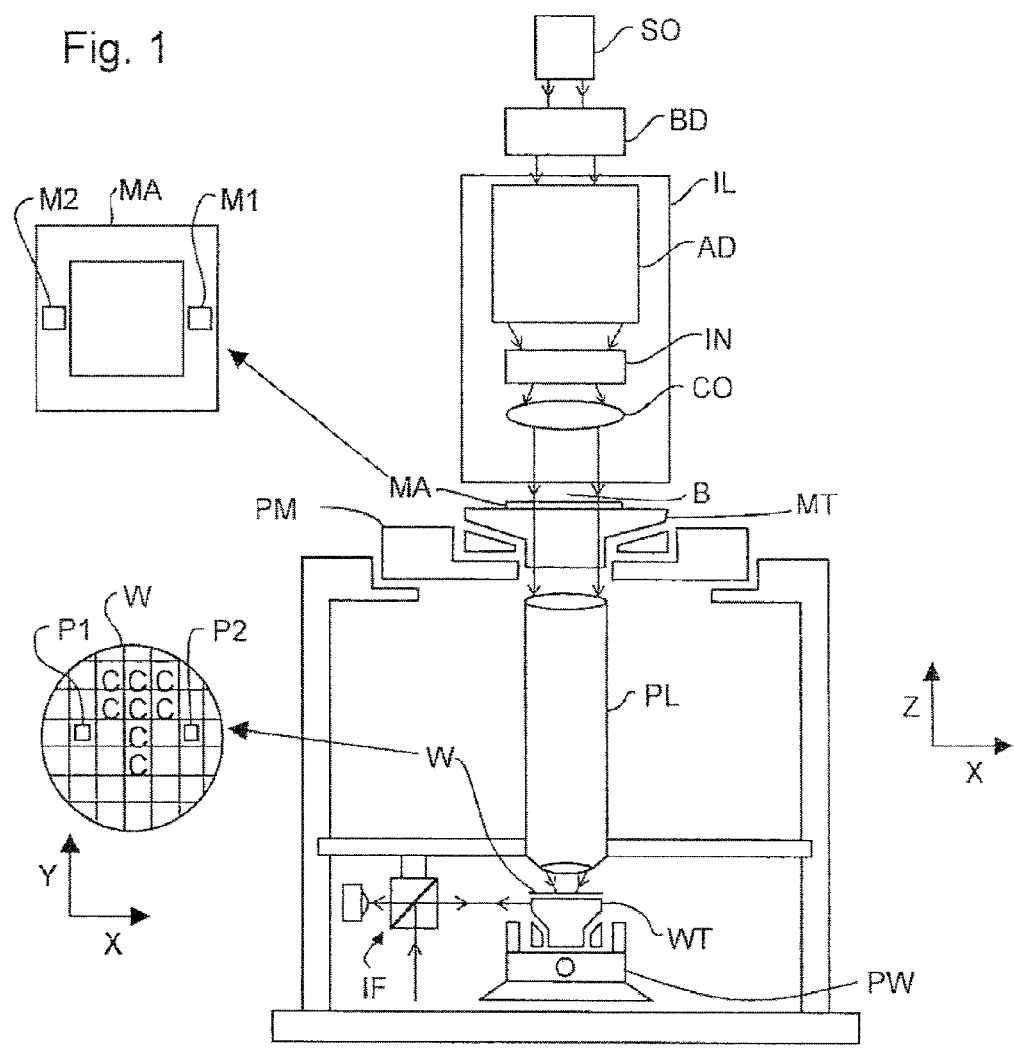
FIG. 1 depicts a lithographic apparatus according to an embodiment of the invention.

The features and advantages of embodiments of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a support structure) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., support structure) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
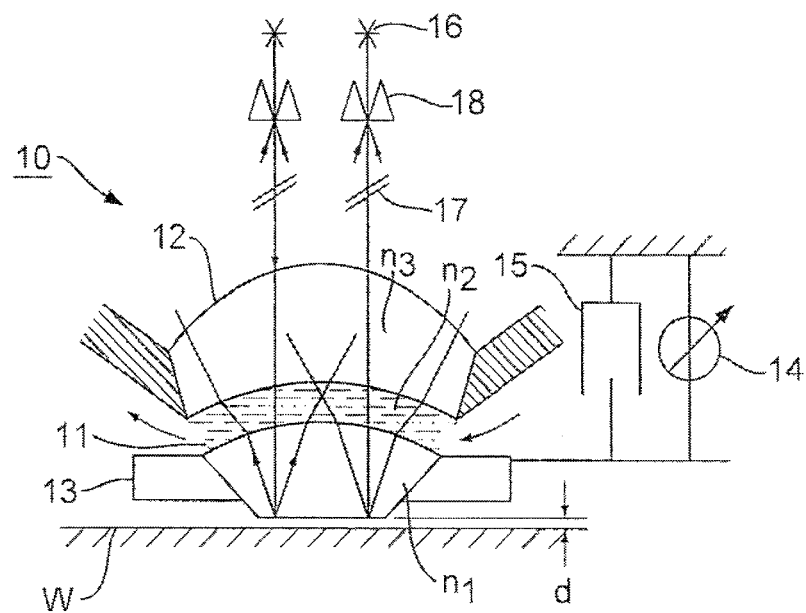
FIG. 2 depicts a final element of a projection system according to an embodiment of the invention.

FIG. 2 shows a final element 13 of the projection system 10 which is a so-called solid immersion lens (SIL) which, in use, is positioned with a very small gap between it and the substrate W. In an embodiment, the gap d is in the range of from about 20 nm to about 50 nm and is maintained with an accuracy in the range of up to about ±2 nm for example. The allowable variation in the gap will depend on the numerical aperture (NA) of the projection system and the allowable apodization in the image. The solid immersion lens utilizes near field optics. In a near-field optical system, there is passage of radiation to, from, through, or near an element with subwavelength features. The radiation, or radiation beam, may be coupled to a second element located a subwavelength distance from the first element. For example the first element may be a final element and the second element may be the surface of the substrate. The imaging on the substrate is co-planar over the focus plane or on the surface of the substrate. The imaging on the substrate may be a complicated pattern. The patterned image forms more than a single focused spot on the substrate. The bulk refractive index of the medium in the gap does not limit the imaging. In effect, the solid immersion lens provides high refractive index imaging with a refractive index of at least 1.8 ($SiO_2$). Higher refractive indexes are possible using high-n glasses such as $BaLiF_3$, MgO, crystalline spinel, ceramic spinel and LuAG. In an embodiment, the refractive index $n_1$ of the final element is in the range of from 1.8 to 2.5.

To maintain the gap with the desired accuracy during exposure, the SIL element 13 is actively levelled by an actuation system 13, 14, 15. In an embodiment the final element 13 is actuated in three degrees of freedom: Z, Rx and Ry, where Z is the direction parallel to the optical axis of the projection system 10 and Rx and Ry are rotations about axes orthogonal to the Z axis. In an embodiment the actuation system actuates the final element in five degrees of freedom: X, Y, Z, Rx and Ry. In an embodiment the actuation system actuates the final element in all six degrees of freedom. The actuation system can use positional information of the SIL element 13 measured with respect to a reference frame, together with knowledge of the substrate topology, which can be measured in advance. Alternatively or in addition, the actuation function can be supported by a gas (e.g. air) bearing or a liquid (e.g. water) bearing.

In an embodiment, the position of the final element is measured with a backscatter detection device 16, 17, 18. This projects a radiation beam through the SIL element at a high NA, e.g. 1.7, and detects the backscattered radiation intensity. If the SIL element moves out of the near field, the scatter intensity drastically increases to full internal reflection. This signal sharply going from low intensity to almost full intensity can be used as a position signal. By taking three of these measurement points distributed over the optical field, the Z,Rx,Ry of the SIL element can be controlled. The only remaining topology is that of the substrate itself.

In an embodiment, a further optical element 12 is provided near the SIL element 13. In an embodiment, the space between the optical element 12 and the SIL element 13 can be filled with a fluid 11, e.g. water from a fluid supply. The further optical element 12 may have a refractive index $n_3$ and the fluid 11 may have refractive index $n_2$.

Figure 3:
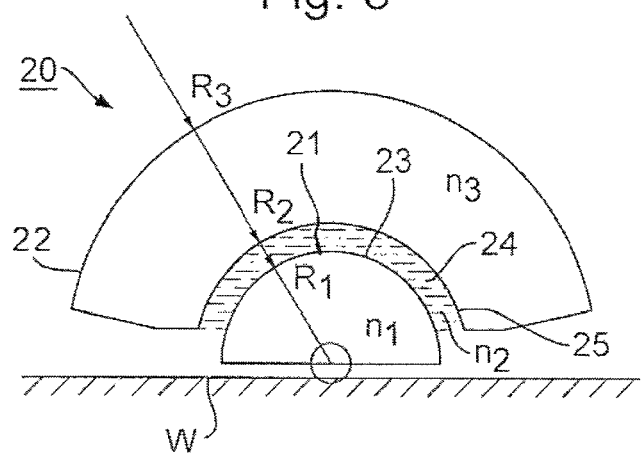
FIG. 3 depicts a final element of a projection system according to an embodiment of the invention.

In an embodiment, the mass of the actuated SIL element is kept as small as possible to make it easier to follow the actuation signal with minimum control error. Therefore, in an embodiment, the optics 20 is split into two concentric parts 21, 22, as shown in FIG. 3. Tilting the inner part around the common center has a minimal effect on the optical properties of the projection system. The effects may be negligible or may be compensated for elsewhere in the projection system, and/or by adjusting the patterning device position. So, the SIL element can follow local tilts of the substrate without (much) optical effect. The space between the 2 concentric optical elements can be filled with a fluid 24, e.g. water from a fluid supply. Using a higher refractive index (liquid) enhances optical coupling also for off-axis field points, thus reducing contrast loss due to apodization. The same effect can be achieved using anti-reflection coatings (AR) 23, 25 on the optical surfaces, or a combination of liquid and anti-reflection coatings.

Figure 4:
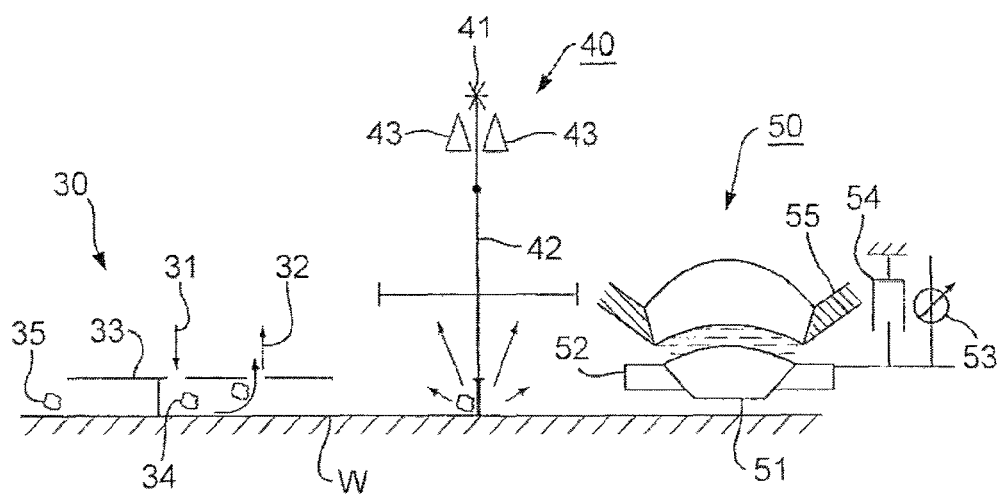
FIG. 4 depicts a final element of a projection system and a cleaning device according to an embodiment of the invention.

Another problem that is experienced with solid immersion lithography is particles 35 on the substrate. Those can get stuck or damage the SIL element of the final element 50. In an embodiment, referring to FIG. 4, immersion wetting/drying technology is used in a cleaning device 30 that removes particles. For example, a cleaning device may supply a liquid (e.g., water such as ultra pure water (UPW) through supply opening 31 of a structure 33 onto the substrate and remove it through extract opening 32 (which may also be part of structure 33) to clean contamination from the substrate. In an embodiment, the surface in front of the SIL element 51 is scanned with a particle detector 40, e.g. a scatterometer. The particle detector may act as an additional failsafe to the cleaning device. A detection beam 42 from a radiation output or source 41 is directed onto the substrate W and any scattered radiation detected by one or more detectors 43. A clean substrate will reflect specularly so that scattered radiation indicates an imperfection or particle. An emergency retract of the SIL element 51, by activation system 52, 53, 54 is triggered in the event of a large scattered signal. In an embodiment, the particle detector is positioned between the cleaning device and the projection system and arranged to detect particles on a part of the substrate that has been cleaned by the cleaning device and is about to be scanned under the projection system.

In an embodiment, the NA can be increased from about 1.35, as achieved in liquid immersion lithography, to about 1.7 with a $SiO_2$ SIL element, enabling an optical resolution limit of half pitch 30 nm instead of 38 nm With refractive indexes of up to 2.1 for LuAG, an effective NA of 2.0 and half pitch 25 nm in a single exposure may be achieved.

Figure 5:
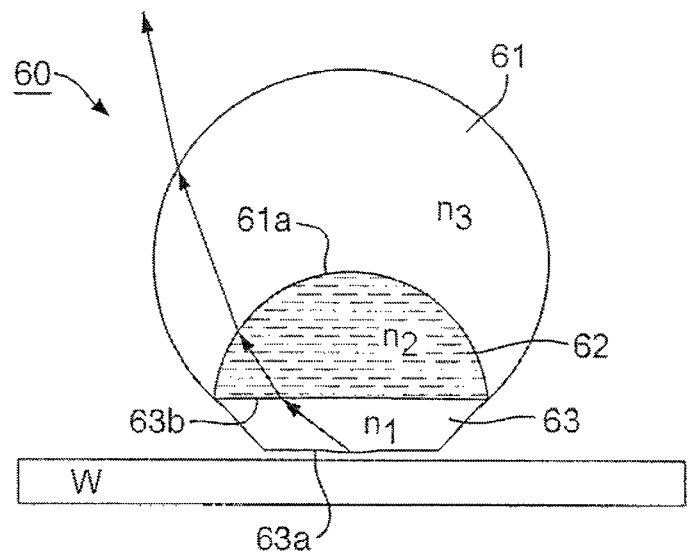
FIG. 5 depicts a final element of a projection system according to an embodiment of the invention.

A final element 60 of a projection system in an embodiment of the invention is shown schematically in FIG. 5. This element is formed in two parts, an inner part 63 and an outer part 61. The inner part 63 is actuated by an actuation system (not shown) while the outer part 61 remains stationary. A first surface 63a of the inner part 63 is maintained during projection at a distance from the substrate W as discussed previously. A second surface 63b of inner part 63 faces a first surface 61a of outer part 61 of final element 60. The second surface 63b of inner part 63 has a larger radius of curvature (i.e. is less curved) than the first surface 61a of outer part 61. The resulting gap is filled with a fluid, e.g. a liquid, 62 having a high refractive index. In an embodiment, the fluid 62 has a refractive index of greater than about 1.4, greater than about 1.45, greater than about 1.5, greater than about 1.55, greater than about 1.8 or greater than about 2.0. The inner and outer part 63, 61 of final element 60 may be made of quartz ($SiO_2$) and have refractive indices $n_1$, $n_3$ of about 1.45. In an embodiment the refractive index $n_2$ of the fluid 62 is greater than the refractive indices $n_1$, $n_3$ of inner and outer parts 63, 61. Suitable liquids include decalin in cis and trans forms, functionalized decalin, and a suspension of nano-particles in water.

In the embodiment of FIG. 5, the mass of the part of the final element that must be actuated to control the spacing to the substrate W is reduced, making it easier to actuate that part with small response times. The high refractive index fluid 62 is contained by the two parts of the final element and therefore the fluid can be selected without limitation to its interaction with the resist and/or topcoat on the substrate W and without limitation to containment of the liquid against a rapidly scanning substrate. The different curvatures of the second surface of the inner part 63 and the first surface of the outer part 61 allow a high optical power to be achieved. In the limit, the second surface of the inner part 63 may have a substantially infinite radius of curvature, i.e. be planar.

Figure 6:
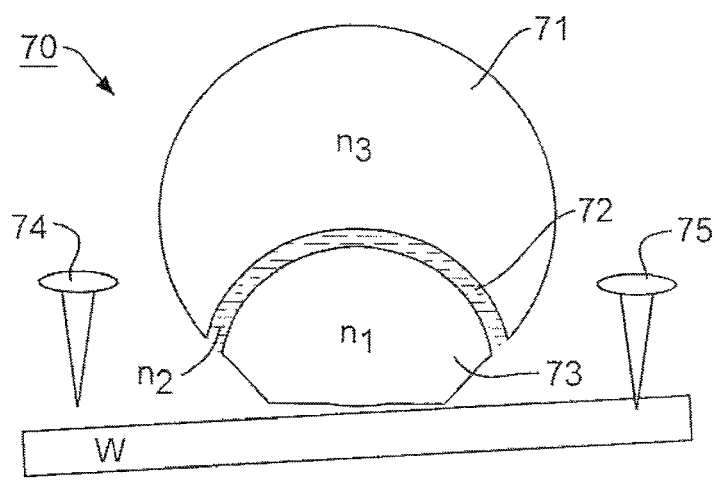
FIG. 6 depicts a final element of a projection system and a level sensor system according to an embodiment of the invention.

A final element 70 and level sensor system 74, 75 according to an embodiment of the invention are shown schematically in FIG. 6. In the embodiment of FIG. 6, the final element comprises inner part 73 and outer part 71 with a gap therebetween filled with fluid 72, similar to the embodiment of FIG. 5. The level sensor system comprises two level sensors 74, 75 which measure the position of the surface of the substrate W relative to a reference, for example a reference or metrology frame of the lithographic apparatus. Sensors 74, 75 may be optical sensors, capacitive sensors or gas gauges as are known in the art. Although two sensors are shown in FIG. 6, more or fewer sensors may be used. Three sensors spaced appropriately around the final element 70 allow for measurement of the position in the direction parallel to the optical axis of the final element 70 (Z) as well as tilt ($R_x, R_y$) about orthogonal axes perpendicular to the optical axis. The level sensor output is used to control the actuation of the final element. In an embodiment, the position of the substrate stage WT is also controlled in parallel. The measured position of the substrate stage and/or previously measured profile of the substrate can also be taken into account in control of the final element.

Figure 7:
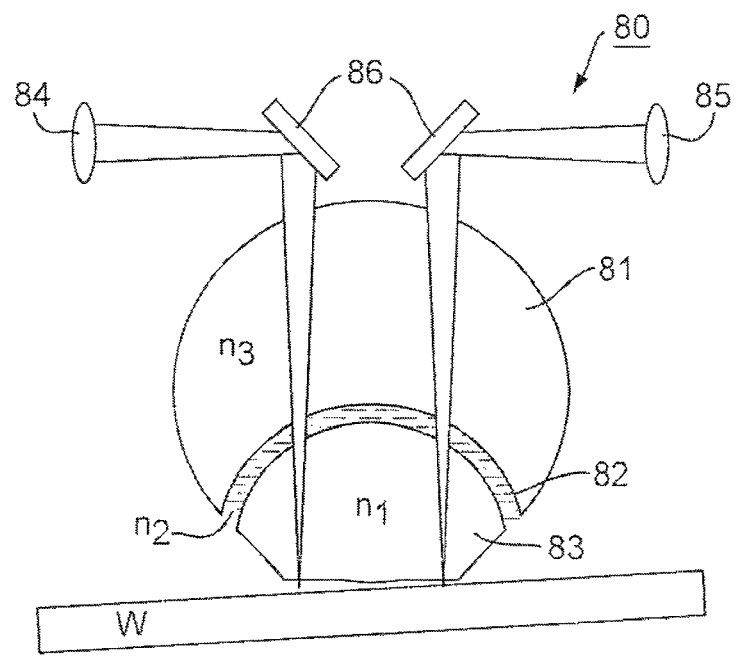
FIG. 7 depicts a final element of a projection system and a level sensor system according to an embodiment of the invention.

FIG. 7 shows a final element 80 of a projection system and a level sensor system according to a further embodiment of the present invention. In this embodiment, the final element comprises inner part 83 and outer part 81. A fluid 82 is confined to the gap between inner and outer parts as discussed previously. The level sensor system comprises one or more optical sensors 84, 85 which direct radiation onto the substrate through the final element 80 to measure the vertical position of points of the substrate within the imaging field of the final element 80. One or more folding mirrors 86 may be provided to couple the optical radiation into the final element 80. In an embodiment, the wavelength of the radiation used by the level sensor is a wavelength to which the resist on the substrate is not sensitive. Again, although two level sensors are shown in FIG. 7, more or fewer sensors can be used. Three sensors allow for determination of Z, $R_x$ and $R_y$.

Figure 8:
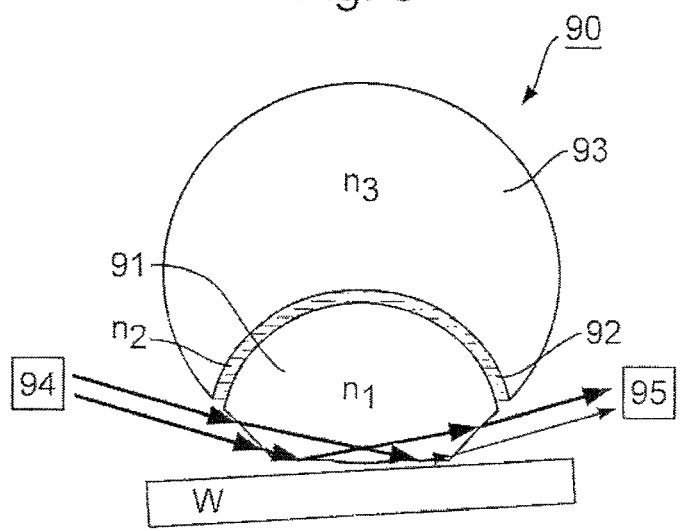
FIG. 8 depicts a final element of a projection system and a level sensor system according to an embodiment of the invention.

FIG. 8 shows a final lens element 90 and a level sensor system 94, 95 according to an embodiment of the invention. As discussed previously, the final element 90 comprises an inner part 91 and an outer part 93. A high refractive index fluid 92 is confined therebetween. The level sensor system comprises a radiation output or source 94 which directs radiation into a side surface of the inner part 91 so that it reflects internally off the lower surface of inner part 91 (the surface facing substrate W). The radiation then exits the side surface of inner part 91 at a diametric opposite point and enters detector 95. The proportion of the radiation that is internally reflected at the lower surface of inner part 91 will depend upon the distance between the inner part 91 and the substrate W. Therefore, the absolute value of the intensity of the reflected radiation and/or changes therein can be used to detect the distance between inner part 91 and substrate W and/or changes in that distance. The use of multiple beams directed at different points on the lower surface of inner part 91 allows the gap distance to be measured at multiple points.

In an embodiment of the present invention, the shape of the opposing surfaces of the inner and outer parts of the final element can be selected to minimize changes in the volume of the gap therebetween as the inner part is actuated. In embodiments of the present invention, the gap between the inner and outer parts of the final element can be connected to a reservoir of fluid to accommodate changes in volume of the gap as the inner part is actuated.

In an embodiment of the present invention, the lower surface of the inner part of the final element of the projection system is coated with a material having a negative refractive index to the radiation of the projection beam. Such materials, known as meta materials or left-handed materials, derive their properties from nanoscopic structure and various different forms thereof are known. The negative refractive index material increases the near field gap between the final element and the substrate. This will give more space to control the final element to maintain the desired near field gap. In an embodiment of the present invention, a diffraction grating forming a diffractive optical element is formed on the lower surface of the inner part of the final element. The diffractive optical element may further assist in reducing the size of the imaged features.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

Embodiments according to the invention are provided in below numbered clauses:

1. A lithographic projection apparatus arranged to project a pattern from a patterning device onto a substrate, the apparatus comprising:

a projection system having a final element, the final element being a refractive optical element that is, in use, spaced away from the substrate by a distance of less than about 100 nm, and is divided into an inner part and an outer part and an actuator system configured to control the position and/or orientation of the inner part of the final element.

2. The apparatus according to clause 1, wherein a surface of the inner part that faces the outer part and a surface of the outer part that faces the inner part are both substantially spherical and have a common center and the actuator system is configured to rotate the inner part of the final element about the common center.

3. The apparatus according to clause 1, wherein a surface of the inner part that faces the outer part has a first radius of curvature and a surface of the outer part that faces the inner part has a second radius of curvature, the first radius of curvature being larger than the second radius of curvature.

4. The apparatus according to clause 3, wherein the first radius of curvature is substantially infinite.

5. The apparatus according to any of the preceding clauses, wherein a gap is defined between the inner and outer parts of the final element and further comprising a fluid supply system configured to supply a fluid to the gap.

6. The apparatus according to clause 5, wherein the fluid supply system is arranged to supply liquid to the gap.

7. The apparatus according to clause 6, wherein the liquid has a refractive index greater than about 1.4, greater than about 1.45, greater than about 1.5, greater than about 1.55, greater than about 1.68 or greater than about 2.0.

8. The apparatus according to clause 6 or clause 7, wherein the inner part has a first refractive index $n_1$ the liquid has a second refractive index $n_2$ and the outer part has a third refractive index $n_3$, wherein $n_2 > n_1$ and $n_2 > n_3$.

9. The apparatus according to any of the preceding clauses, further comprising a sensor system configured to detect a distance between the final element and the substrate.

10. The apparatus according to clause 9, wherein the sensor system comprises a plurality of optical sensors configured to measure the position of a plurality of points on the substrate relative to a reference.

11. The apparatus according to clause 10, wherein the optical sensors are configured to measure the position of each of a plurality of points on the substrate that are outside a projection field of the projection system.

12. The apparatus according to clause 10 or clause 11, wherein the optical sensors are configured to measure the position of each of a plurality of positions on the substrate that are within a projection field of the projector system.

13. The apparatus according to clause 12, wherein the optical sensors are configured to direct radiation beams onto the substrate through the inner and outer parts of the final element.

14. The apparatus according to any of clauses 9-12, configured to direct radiation beams into a side surface of the inner part of the final element so that the radiation beams internally reflect on a surface of the inner part of the final element that faces the substrate.

15. The apparatus according to clause 14, wherein a surface of the inner part of the final element that faces the substrate has a coating thereon, the coating being made of a material having a negative refractive index.

16. The apparatus according to clause 14 or clause 15, wherein a surface of the inner part of the final element that faces the substrate has a diffraction grating formed thereon.

17. The apparatus according to any of the preceding clauses, wherein the actuator system is configured to control the inner part of the final element in at least one degree of freedom selected from the group consisting of: position along an optical axis of the projection system and rotation about an axis perpendicular to the optical axis.

18. The apparatus according to any of the preceding clauses, wherein the actuator system is configured to control the position of the inner part of the final element along an optical axis of the projection system and rotation of the inner part of the final element about two orthogonal axes perpendicular to the optical axis.

19. Apparatus according to any of the preceding clauses, further comprising a backscatter detection system configured to detect radiation reflected back into the projection system from an exit surface of the final element.

20. The apparatus according to clause 19, wherein the backscatter detection system is configured to detect respective intensities of radiation reflected from three spaced-apart locations on the exit surface of the final element.

21. The apparatus according to any of the preceding clauses, further comprising a cleaning device arranged to clean the substrate.

22. The apparatus according to clause 21, further comprising a positioning device arranged to scan the substrate relative to the projection system while an image is being projected thereon, and wherein the cleaning device is arranged to clean an area of the substrate before that area is scanned under the projection system.

23. The apparatus according to clause 21 or clause 22, wherein the cleaning device is arranged to wash the substrate with water.

24. The apparatus according to any of the preceding clauses, further comprising a particle detector arranged to detect particles on a part of the substrate that is about to be scanned under the projection system.

25. The apparatus according to clause 24, wherein the particle detector is positioned between a cleaning device arranged to clean the substrate and the projection system and arranged to detect particles on a part of the substrate that has been cleaned by the cleaning device and is about to be scanned under the projection system.

26. The apparatus according to clause 24 or clause 25, wherein the actuator system is responsive to the particle detector and arranged to move the final element away from the substrate in the event of detection of a particle.

27. The apparatus according to any of the preceding clauses, wherein the distance is less than the wavelength of a projection beam projecting the pattern onto the substrate.

28. The apparatus according to clause 27, wherein the wavelength is about 193 nm.

29. A device manufacturing method comprising:

projecting a patterned beam of radiation onto a substrate using a projection system having a final element to project the patterned beam, the final element being a refractive optical element that is spaced away from the substrate by a distance of less than about 100 nm and being divided into an inner part and an outer part; and controlling the position and/or orientation of the inner part of the final element using an actuator system during the projection.

The invention claimed is:

1. A lithographic projection apparatus arranged to project a pattern from a patterning device onto a substrate, the apparatus comprising:

a substrate table configured to hold the substrate;

a projection system having a final element, the final element being a refractive optical element that is divided into an inner part and an outer part;

an actuator configured to change the position and/or orientation of the inner part of the final element relative to the outer part, the actuator configured to at least rotate the inner part about an axis perpendicular to the optical axis; and a control system configured to control the actuator and/or the position of the substrate table such that the inner part is spaced away from the substrate by a distance of less than about 100 nm.

2. The apparatus according to claim 1, wherein a surface of the inner part that faces the outer part and a surface of the outer part that faces the inner part are both substantially spherical and have a common center and the actuator is configured to rotate the inner part of the final element about the common center.

3. The apparatus according to claim 1, wherein a surface of the inner part that faces the outer part has a first radius of curvature and a surface of the outer part that faces the inner part has a second radius of curvature, the first radius of curvature being larger than the second radius of curvature.

4. The apparatus according to claim 3, wherein the first radius of curvature is substantially infinite.

5. The apparatus according to claim 1, wherein a gap is defined between the inner and outer parts of the final element and further comprising a fluid supply system configured to supply a fluid to the gap.

6. The apparatus according to claim 5, wherein the fluid comprises liquid.

7. The apparatus according to claim 6, wherein the inner part has a first refractive index $n_1$ the liquid has a second refractive index $n_2$ and the outer part has a third refractive index $n_3$, wherein $n_2 > n_1$ and $n_2 > n_3$.

8. The apparatus according to claim 1, further comprising a sensor system configured to detect a distance between the final element and the substrate.

9. The apparatus according to claim 8, wherein the sensor system comprises a plurality of optical sensors configured to measure the position of a plurality of points on the substrate relative to a reference.

10. The apparatus according to claim 9, wherein the optical sensors are configured to measure the position of each of a plurality of points on the substrate that are outside a projection field of the projection system.

11. The apparatus according to claim 9, wherein the optical sensors are configured to measure the position of each of a plurality of positions on the substrate that are within a projection field of the projector system.

12. The apparatus according to claim 11, wherein the optical sensors are configured to direct radiation beams onto the substrate through the inner and outer parts of the final element.

13. The apparatus according to claim 8, configured to direct radiation beams into a side surface of the inner part of the final element so that the radiation beams internally reflect on a surface of the inner part of the final element that faces the substrate.

14. The apparatus according to claim 1, wherein the actuator is configured to rotate the inner part of the final element about two orthogonal axes perpendicular to the optical axis.

15. The apparatus according to claim 1, further comprising a backscatter detection system configured to detect radiation reflected back into the projection system from an exit surface of the final element.

16. The apparatus according to claim 15, wherein the backscatter detection system is configured to detect respective intensities of radiation reflected from three spaced-apart locations on the exit surface of the final element.

17. A device manufacturing method comprising:
projecting a patterned beam of radiation onto a substrate using a projection system having a final element to project the patterned beam, the final element being a refractive optical element and being divided into an inner part and an outer part;

controlling the position of the substrate and/or the final element such that the final element is spaced away from the substrate by a distance of less than about 100 nm; and controlling the position and/or orientation of the inner part of the final element relative to the outer part using an actuator system during the projection, the actuator system configured to at least rotate the inner part about an axis perpendicular to the optical axis.

18. A lithographic projection apparatus arranged to project a pattern from a patterning device onto a substrate, the apparatus comprising:
a substrate table configured to hold the substrate;
a projection system having a final element, the final element being a refractive optical element that is divided into an inner part and an outer part, wherein a surface of the outer part that faces the inner part is substantially spherical about a center;

an actuator configured to change the position and/or orientation of the inner part of the final element relative to the outer part; and a control system configured to control the actuator and/or the position of the substrate table such that the inner part is spaced away from the substrate by a distance of less than about 100 nm and configured to control the actuator to rotate the inner part of the final element about substantially the center of the spherical surface of the outer part.

19. The method according to claim 17, wherein a gap is defined between the inner and outer parts of the final element and further comprising (i) supplying a fluid having a refractive index of greater than or equal to 1.4 to the gap, or (ii) an anti-reflective coating on a surface of the inner part that faces the outer part and/or on a surface of the outer part that faces the inner part, or (iii) both (i) and (ii).

20. A lithographic projection apparatus arranged to project a pattern from a patterning device onto a substrate, the apparatus comprising:
a substrate table configured to hold the substrate;
a projection system having a final element, the final element being a refractive optical element that is divided into an inner part and an outer part;
an actuator configured to change the position and/or orientation of the inner part of the final element relative to the outer part,
wherein a gap is defined between the inner and outer parts of the final element and further comprising (i) a fluid supply system configured to supply a fluid having a refractive index of greater than or equal to 1.4 to the gap, or (ii) an anti-reflective coating on a surface of the inner part that faces the outer part across the gap and/or on a surface of the outer part that faces the inner part across the gap, or (iii) both (i) and (ii).

21. The apparatus of claim 20, further comprising a control system configured to control the actuator and/or the position of the substrate table such that the inner part is spaced away from the substrate by a distance of less than about 100 nm.

22. The apparatus of claim 20, comprising the fluid supply system configured to supply a fluid having a refractive index of greater than or equal to 1.4 to the gap.

23. The apparatus of claim 20, comprising the anti-reflective coating on a surface of the inner part that faces the outer part across the gap and/or on a surface of the outer part that faces the inner part across the gap.

* * * * *